(12) United States Patent
Koch et al.

(10) Patent No.: US 9,176,198 B2
(45) Date of Patent: Nov. 3, 2015

(54) BATTERY STATE ESTIMATOR WITH OVERPOTENTIAL-BASED VARIABLE RESISTORS

(75) Inventors: Brian J. Koch, Berkley, MI (US); Krishnan S. Hariharan, Bangalore (IN); Senthil K. Vadivelu, Bangalore (IN)

(73) Assignee: GM Global Technology Operations LLC, Detroit, MI (US)

( * ) Notice: Subject to any disclaimer, the term of this patent is extended or adjusted under 35 U.S.C. 154(b) by 880 days.

(21) Appl. No.: 13/399,550

(22) Filed: Feb. 17, 2012

(65) Prior Publication Data

US 2013/0218496 A1    Aug. 22, 2013

(51) Int. Cl.
| | | |
|---|---|---|
| *G01R 31/36* | (2006.01) |
| *B60L 11/18* | (2006.01) |
| *G01R 19/00* | (2006.01) |
| *H01M 10/052* | (2010.01) |
| *H01M 10/48* | (2006.01) |

(52) U.S. Cl.
CPC ......... *G01R 31/3651* (2013.01); *B60L 11/1851* (2013.01); *G01R 31/3627* (2013.01); *G01R 31/3637* (2013.01); *G01R 31/3662* (2013.01); *H01M 10/052* (2013.01); *H01M 10/48* (2013.01); *Y02T 10/7005* (2013.01); *Y02T 10/705* (2013.01); *Y02T 10/7011* (2013.01)

(58) Field of Classification Search
CPC .................. G01R 31/3627; G01R 31/3637
USPC ..................................... 702/63–65
See application file for complete search history.

(56) References Cited

U.S. PATENT DOCUMENTS

| | | | |
|---|---|---|---|
| 7,646,166 B2 | 1/2010 | Koch et al. | |
| 2008/0135316 A1* | 6/2008 | Koch et al. | 180/65.4 |
| 2009/0091299 A1 | 4/2009 | Lin | |

FOREIGN PATENT DOCUMENTS

JP    H08-55639 A    2/1996

* cited by examiner

*Primary Examiner* — Phuong Huynh
(74) *Attorney, Agent, or Firm* — John A. Miller; Miller IP Group, PLC

(57) ABSTRACT

A battery model and equivalent circuit that includes an ohmic resistance, a first RC-pair that models a battery cell charge transfer reaction and double layer processes and a second RC-pair that models battery cell diffusion. Each of the ohmic resistance, the charge transfer reaction resistance and the diffusion resistance in the model are variable resistances, where each resistance changes in response to a change in voltage potential across the resistance.

20 Claims, 1 Drawing Sheet

BATTERY STATE ESTIMATOR WITH OVERPOTENTIAL-BASED VARIABLE RESISTORS

BACKGROUND OF THE INVENTION

1. Field of the Invention

This invention relates generally to a circuit model for estimating state-of-charge (SOC) for a battery on a vehicle and, more particularly, to a circuit model that estimates state-of-charge for a battery on a vehicle while the vehicle is operating, where resistances within the circuit model are variable based on voltage.

2. Discussion of the Related Art

Electric vehicles are becoming more and more prevalent. These vehicles include hybrid vehicles, such as the extended range electric vehicles (EREV) that combines a battery and a main power source, such as an internal combustion engine, fuel cell system, etc., and electric only vehicles, such as the battery electric vehicles (BEV). All of these types of electric vehicles employ a high voltage battery that includes a number of battery cells. These batteries can be different battery types, such as lithium-ion, nickel metal hydride, lead acid, etc. The battery can include individual battery modules where each battery module may include a certain number of battery cells, such as twelve cells. The individual battery cells may be electrically coupled in series, or a series of cells may be electrically coupled in parallel, where a number of cells in the module are connected in series and each module is electrically coupled to the other modules in parallel. Different vehicle designs include different battery designs that employ various trade-offs and advantages for a particular application.

Batteries play an important role in powering electrical vehicles and hybrid vehicles. Lithium-ion batteries have proven to be promising for hybrid electric vehicles. The effectiveness of battery control and power management is essential to vehicle performance, fuel economy, battery life and passenger comfort. For battery control and power management, two states of the battery, namely, state-of-charge (SOC) and battery power capability, need to be predicted, or estimated, and monitored in real time because they are seldom measurable during vehicle operation. Battery state-of-charge and battery power can, however, be estimated from the measured battery current and voltage by solving for the parameters in an equation that describes an equivalent circuit model of the battery. These parameters include an ohmic resistance associated with the electron conductors within the cell, RC pairs to describe the electrochemical reaction at the electrode-electrolyte interface and the effects of diffusion in the solid and liquid states, and an open circuit voltage (OCV) that varies with the concentrations of reactants and products involved in the reaction. The OCV may be directly converted to an estimate of state-of-charge, and the circuit model equation may be arranged and solved for power capability when the values of the other parameters are known. Many battery state estimation algorithms based on the premise of circuit model representations have been developed in the art using different methodologies and some have been implemented in vehicles.

It is well known that battery dynamics are generally non-linear and highly dependent on battery operating conditions. However, for on-board battery parameter estimation, a linear model that has a few frequency modes is used to approximate a battery's dominant dynamics for a specific application, such as power prediction or SOC estimation. The reason for this is mainly due to limited computational power and memory available for on-board applications. In fact, even if there was unlimited computational power and memory, an accurate estimation of all battery parameters in a complex model with as many frequency modes as possible cannot be guaranteed because some information about the full range of dynamic behavior may be lacking from the measured terminal voltage and terminal current for any given level of observed excitation. Therefore, it is neither practical nor necessary to cover all frequency modes in one model as long as the estimation error caused by model uncertainties is within an acceptable range for a specific application.

U.S. patent application Ser. No. 11/867,497, filed Oct. 4, 2007, now published as Patent Application Publication No. U.S. 2009/0091299, titled Dynamically Adaptive Method For Determining The State of Charge of a Battery, assigned to the assignee of this invention and herein incorporated by reference, discloses a method for determining battery state-of-charge and battery power using four battery parameters, namely, the battery OCV, ohmic resistance, and the resistance and capacitance of an RC pair.

It is common practice to measure the voltage of a battery that has been at rest for a significant period of time and to convert this voltage measurement to an estimate of state-of-charge. In this situation, the measured terminal voltage is regarded as being equal to the open circuit voltage (OCV), and is directly observable, so the solution of a complex circuit model equation is unnecessary. However, if there are loads on the battery, which is normally the case when the vehicle is operating, it is necessary to remove or subtract from the measured terminal voltage the loss of voltage caused by those loads in order to estimate the OVC. For a battery SOC estimation model using an equivalent circuit, the model is complex and must be accurate so that the voltage losses attributed to various elements of the circuit model can be accurately removed from the terminal voltage to get a proper estimation of the battery SOC. The above mentioned simplified circuit model of the battery polarization is generally effective for calculating battery SOC. However, during certain operating conditions, such as low temperature, high or low battery SOC, etc., the complexity of the actual battery chemistry does not allow the simplified circuit model to accurately represent those conditions.

U.S. Pat. No. 7,646,166 issued Jan. 12, 2010 to Koch et al., titled Method and Apparatus for Modeling Diffusion in an Electrochemical System, assigned to the assignee of this application and herein incorporated by reference, discloses a technique for modeling a vehicle battery circuit for determining battery SOC that includes a diffusion circuit element having a variable resistance to more accurately define the diffusion portion of the model circuit. The variable resistance is controlled in the diffusion circuit element based on the capacitance of a capacitor in an RC pair in that circuit element.

SUMMARY OF THE INVENTION

In accordance with the teachings of the present invention, a battery model and equivalent circuit is disclosed that includes an ohmic resistance, a first RC-pair that models a battery cell charge transfer reaction and double layer processes and a second RC-pair that models battery cell diffusion. Each of the ohmic resistance, the charge transfer reaction resistance and the diffusion resistance in the model are variable resistances, where each resistance changes in response to a change in voltage potential across the resistance.

DETAILED DESCRIPTION OF THE EMBODIMENTS

The following discussion of the embodiments of the invention directed to a battery circuit model including variable resistances based on voltage is merely exemplary in nature, and is in no way intended to limit the invention or its applications or uses. For example, the battery circuit model has particular application for a vehicle battery. However, as will be appreciated by those skilled in the art, the battery model may have application for other types of batteries.

Figure 1:
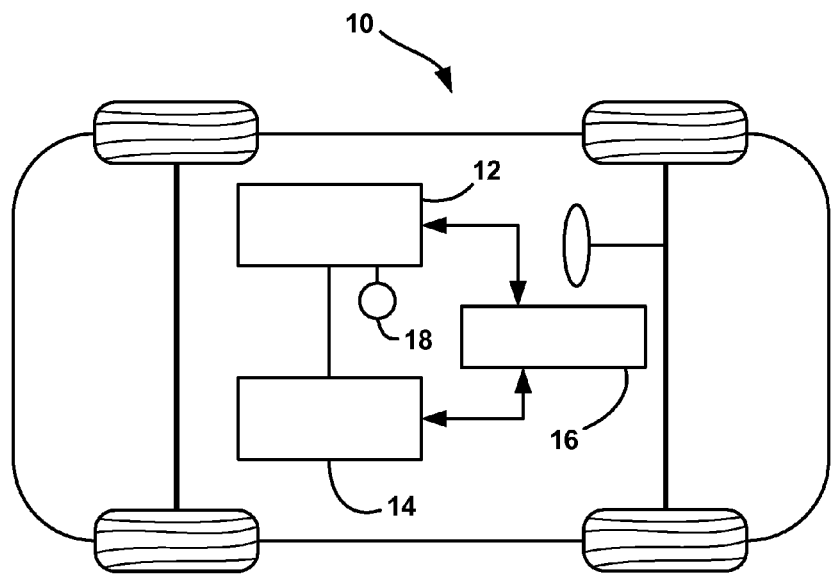
FIG. 1 is a simplified plan view of a hybrid vehicle including a battery and a main power source.

FIG. 1 is a simplified plan view of a vehicle 10 including a high voltage battery 12 and a main power source 14, where the vehicle 10 is intended to represent any hybrid vehicle, such as hybrid internal combustion engine vehicles, fuel cell system vehicle, etc. The vehicle 10 is also intended to represent any electric only vehicle that only employs a battery as the lone power source. The vehicle 10 includes a controller 16 that is intended to represent all of the control modules and devices necessary for the proper operation and control of the power provided by the battery 12 and the power source 14 to drive the vehicle 10, recharge the battery 12 by the power source 14 or provide regenerative braking, and determine the battery SOC and power capability. A temperature sensor 18 provides a temperature measurement of the battery 12 for reasons that will become apparent from the discussions below.

Figure 2:
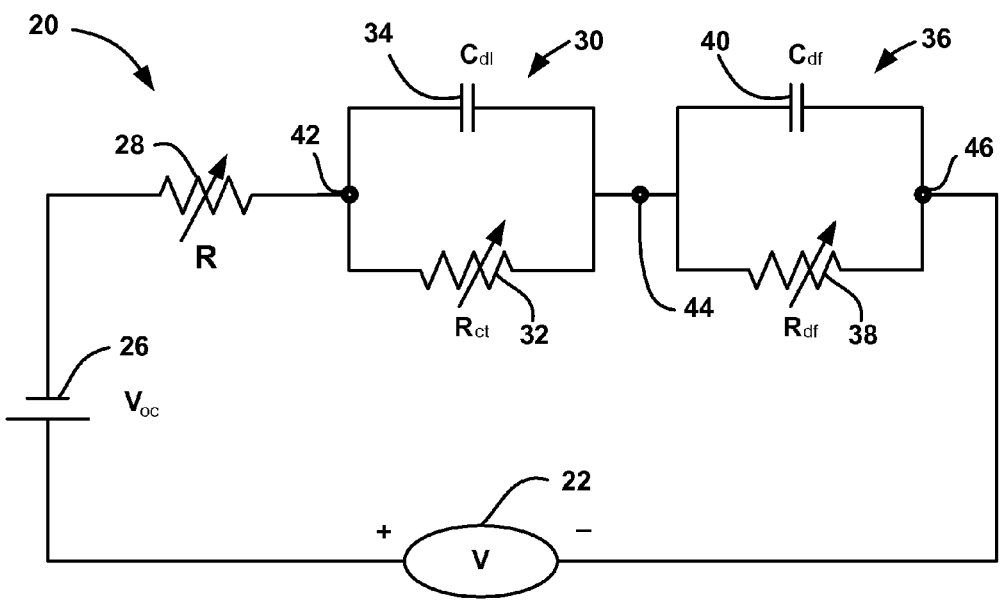
FIG. 2 is a schematic diagram of a battery circuit model including variable resistances.

FIG. 2 is a schematic diagram of a two RC-pair equivalent circuit 20 provided as a battery model. The circuit 20 includes a potential at node 22 that is the battery voltage and includes the battery current. A source 26 represents the battery open circuit voltage $V_{OC}$ and a resistor 28 represents the ohmic resistance R of the circuit 20. A first RC-pair 30 models the battery cell charge transfer reaction and double layer processes, well known to those skilled in the art, in the battery 12. The RC-pair 30 includes a capacitor 34 being a double layer (dl) capacitance $C_{dl}$ and a variable resistor 32 being a charge transfer (ct) reaction resistance $R_{ct}$. A second RC-pair 36 models the battery cell solid state diffusion charge, also well known to those skilled in the art, of the battery 12. The RC-pair 36 includes a variable resistor 38 being a diffusion resistance $R_{df}$ and a capacitor 40 being a diffusion capacitance $C_{df}$.

The basic equivalent circuit model shown by the circuit 20 where the resistors 28, 32 and 38 are not variable, but are fixed resistors, is a well known equivalent circuit for a battery model to those skilled in the art. As discussed above, it is not possible to accurately model battery state-of-charge during operation of the battery 12 under certain conditions because of the complexity that would be required for that model and the computational power that would be required to monitor the model. Therefore, for certain operating conditions, the known battery circuit model does not provide the most accurate battery SOC.

According to the invention, each of the fixed resistors in the known circuit model is replaced with the variable resistors 28, 32 and 38 whose resistance changes at each calculation time step based on the voltage across the particular resistor. Particularly, the resistance of the ohmic resistor 28 changes in response to the measured voltage of the source 22, the resistance of the resistor 32 changes in response to the voltage potential across the RC-pair 30 at nodes 42 and 44 and the resistance of the resistor 38 changes with the voltage potential across the RC-pair 36 at nodes 44 and 46. The discussion below shows how each of those resistances are changed in response to voltage, where R is the resistance of the resistor 28, $R_1$ is the resistance of the resistor 32 and $R_2$ is the resistance of the resistor 38.

The resistances R, $R_1$ and $R_2$ are determined based on voltage and current balance equations (1)-(5) below for the voltage V and the current I in the circuit 20, where the resistance $R_1$ for the charge transfer is based on theory and the resistances R and $R_2$ are based on experimental data.

$$V = V_0 + IR + \Sigma_n V_n \tag{1}$$

$$I = I_{C_n} + I_{R_n} \tag{2}$$

$$I_{C_n} = \frac{dQ_n}{dt} \tag{3}$$

$$Q_n = V_n C_n \tag{4}$$

$$I = \frac{d}{dt}[C_n V_n] + \frac{V_n}{R_n} \tag{5}$$

Where $V_0$ is the open circuit voltage, n is the index of the RC pair under consideration (either 30 or 36), $I_{C_n}$ is the current flow through the capacitors 34 or 40, $I_{R_n}$ is the current flow through the resistors 32 or 38, and Q is charge, where the voltage is determined across the RC-pair 30 and the RC-pair 36 at every time step.

The resistance $R_1$ at a particular point in time can be determined based on a charge transfer reaction at the battery electrodes as:

$$i = i_0 \left[ \exp\left(\frac{FV_1}{2R_G T}\right) - \exp\left(-\frac{FV_1}{2R_G T}\right) \right] \tag{6}$$

$$R_1 = \frac{r_{10}}{\cosh\left(\frac{F}{2R_g T} V_1\right)} \tag{7}$$

Where i is the current generated due to the charge transfer reaction, $i_0$ is the exchange current density, F is Faradays constant, $V_1$ is the voltage across the nodes 42 and 44, T is the temperature of the battery 12 provided, for example, by the temperature sensor 80, and $R_g$ is the ideal gas constant and $r_{10}$ is a fixed and calibratable resistance determined experimentally.

Equations (1)-(5) can be cast in a state space framework of the circuit 20 as:

$$\begin{bmatrix} dV_1/dt \\ dV_2/dt \end{bmatrix} = \begin{bmatrix} -1/R_1 C_1 & 0 \\ 0 & -1/R_2 C_2 \end{bmatrix} \begin{bmatrix} V_1 \\ V_2 \end{bmatrix} + \begin{bmatrix} 1/C_1 \\ 1/C_2 \end{bmatrix} I \tag{8}$$

$$V = V_0 + IR + V_1 + V_2 \tag{9}$$

Where $V_2$ is the voltage across the nodes 44 and 46, $C_1$ is the capacitance of the capacitor 34, and $C_2$ is the capacitance of the capacitor 40.

For solving equations (8) and (9), the resistances R and $R_2$ are proposed to be of the following form.

$$R_2 = r_{20} V_2^{1-r_{21}} \quad (10)$$

$$R = r_0 V^{1-r_1} \quad (11)$$

Where $r_{20}$, $r_{21}$, $r_0$ and $r_1$ are fixed and calibratable resistances determined experimentally.

The capacitances and resistances in equations (7)-(11) vary depending on a number of factors, including temperature, battery cell chemistry, battery capacity, battery size, etc. Non-limiting example values for these parameters are provided in Tables I and II below.

TABLE I

| Parameter | Value |
|---|---|
| $r_{10}$ | 0.00022062 |
| $C_1$ | 8009.3 |
| $r_{20}$ | 0.002211 |
| $r_{21}$ | 1.0029 |
| $C_2$ | 13825 |
| $r_0$ | 0.0038741 |
| $r_1$ | 1.5406 |

TABLE II

| Parameter | Value |
|---|---|
| $r_{10}$ | 6.9156e−005 |
| $C_1$ | 1167 |
| $r_{20}$ | 7.7218e−005 |
| $r_{21}$ | 2.0432 |
| $C_2$ | 17399 |
| $r_0$ | 0.0035992 |
| $r_1$ | 2.0483 |

It is noted that the equivalent circuit 20 that models the battery 12 may have various applications in the art including, but not limited to, a battery state estimator for the SOC of the battery 12 during operation of the vehicle 10.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A circuit model for a battery comprising:
   a voltage source;
   an ohmic variable resistor electrically coupled in series with the voltage source;
   a first RC-pair electrically coupled in series with the ohmic variable resistor and the voltage source, said first RC-pair including a first capacitor and first variable resistor electrically coupled in parallel; and
   a second RC-pair electrically coupled in series with the first RC-pair, the ohmic variable resistor and the voltage source, said second RC-pair including a second capacitor and a second variable resistor electrically coupled in parallel, wherein each of the ohmic variable resistor, the first variable resistor and the second variable resistor have a variable resistance that changes in response to a voltage potential across each resistor.

2. The circuit model according to claim 1 wherein the first RC-pair models a charge transfer reaction and double layer processes in battery cells in the battery.

3. The circuit model according to claim 1 wherein the second RC-pair models battery cell diffusion in the battery.

4. The circuit model according to claim 1 wherein the battery is a vehicle battery.

5. The circuit model according to claim 4 wherein the battery is a lithium-ion battery.

6. The circuit model according to claim 1 wherein a resistance of the ohmic variable resistor is based on the equation:

$$R = r_0 V^{1-r_1}$$

where R is the resistance of the ohmic variable resistor, V is the cell voltage across the ohmic variable resistor, and $r_0$ and $r_1$ are predetermined constant resistances.

7. The circuit model according to claim 1 wherein a resistance of the first variable resistor is based on the equation:

$$R_1 = \frac{r_{10}}{\cosh\left(\frac{F}{2R_g T} V_1\right)}$$

where $R_1$ is the resistance of the first variable resistor, $V_1$ is the voltage across the first variable resistor, F is Faradays constant, T is temperature of the battery, $R_g$ is the ideal gas constant and $r_{10}$ is a predetermined constant resistance.

8. The circuit model according to claim 1 wherein a resistance of the second variable resistor is based on the equation:

$$R_2 = r_{20} V_2^{1-r_{21}}$$

where $R_2$ is the resistance of the second variable resistor, $V_2$ is the voltage across the second variable resistor, and $r_{20}$ and $r_{21}$ are predetermined constant resistances.

9. The circuit model according to claim 1 wherein the circuit model is part of a battery state estimator.

10. A circuit model for a battery comprising:
    a voltage source;
    an ohmic variable resistor electrically coupled in series with the voltage source; and
    at least one RC-pair electrically coupled in series with the ohmic variable resistor and the voltage source, said at least one RC-pair including a capacitor and an RC-pair variable resistor electrically coupled in parallel, wherein each of the ohmic variable resistor and the RC-pair variable resistor have a variable resistance that changes in response to a voltage potential across the each resistor.

11. The circuit model according to claim 10 wherein a resistance of the ohmic variable resistor is based on the equation:

$$R = r_0 V^{1-r_1}$$

where R is the resistance of the ohmic variable resistor, V is the cell voltage across the ohmic variable resistor, and $r_0$ and $r_1$ are predetermined constant resistances.

12. The circuit model according to claim 10 wherein the at least one RC-pair is a first RC pair that models a battery cell charge transfer reaction and double layer processes and a second RC-pair that models battery cell diffusion.

13. The circuit model according to claim 12 wherein the first RC-pair includes a variable resistor that has a resistance which varies based on the equation:

$$R_1 = \frac{r_{10}}{\cosh\left(\frac{F}{2R_g T} V_1\right)}$$

where $R_1$ is the resistance of the variable resistor, $V_1$ is the voltage across the first variable resistor, F is Faradays constant, T is temperature of the battery, $R_g$ is the ideal gas constant and $r_{10}$ and a predetermined constant resistance.

14. The circuit model according to claim 12 wherein the second RC-pair includes a variable resistor that has a resistance which varies based on the equation:

$$R_2 = r_{20} V_2^{1-r_{21}}$$

where $R_2$ is the resistance of the variable resistor, $V_2$ is the voltage across the variable resistor, and $r_{20}$ and $r_{21}$ are predetermined constant resistances.

15. The circuit model according to claim 10 wherein the battery is a vehicle battery.

16. The circuit model according to claim 15 wherein the battery is a lithium-ion battery.

17. The circuit model according to claim 10 wherein the circuit model is part of a battery state estimator.

18. A circuit model for a vehicle battery comprising:
a voltage source;
an ohmic variable resistor electrically coupled in series with the voltage source, wherein a resistance of the ohmic variable resistor is based on the equation:

$$R = r_0 V^{1-r_1}$$

where R is the resistance of the ohmic variable resistor, V is the cell voltage across the ohmic variable resistor, and $r_0$ and $r_1$ are predetermined constant resistances;
a first RC-pair electrically coupled in series with the ohmic variable resistor and the voltage source, said first RC-pair including a first capacitor and a first variable resistor electrically coupled in parallel, wherein a resistance of the first variable resistor is based on the equation:

$$R_1 = \frac{r_{10}}{\cosh\left(\frac{F}{2R_g T} V_1\right)}$$

where $R_1$ is the resistance of the first variable resistor, $V_1$ is the voltage across the first variable resistor, F is Faradays constant, T is temperature of the battery, $R_g$ is the ideal gas constant and $r_{10}$ is a predetermined constant resistance; and
a second RC-pair electrically coupled in series with the first RC-pair, the ohmic variable resistor and the voltage source, said second RC-pair including a second capacitor and a second variable resistor electrically coupled in parallel, wherein a resistance of the second variable resistor is based on the equation:

$$R_2 = r_{20} V_2^{1-r_{21}}$$

where $R_2$ is the resistance of the second variable resistor, $V_2$ is the voltage across the second variable resistor, and $r_{20}$ and $r_{21}$ are predetermined constant resistances.

19. The circuit model according to claim 18 wherein the battery is a lithium-ion battery.

20. The circuit model according to claim 18 wherein the circuit model is part of a battery state estimator.

* * * * *